United States Patent
Song et al.

(10) Patent No.: US 12,424,582 B2
(45) Date of Patent: Sep. 23, 2025

(54) SEMICONDUCTOR PACKAGE INCLUDING A PLURALITY OF SEMICONDUCTOR CHIPS

(71) Applicant: SAMSUNG ELECTRONICS CO., LTD., Suwon-si (KR)

(72) Inventors: Hyeonjun Song, Suwon-si (KR); Jungmin Ko, Suwon-si (KR); Taehyeong Kim, Suwon-si (KR); Youngwoo Lim, Suwon-si (KR); Dongki Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 416 days.

(21) Appl. No.: 18/165,419

(22) Filed: Feb. 7, 2023

(65) Prior Publication Data
US 2023/0420403 A1 Dec. 28, 2023

(30) Foreign Application Priority Data
Jun. 28, 2022 (KR) ........................ 10-2022-0078695

(51) Int. Cl.
*H01L 23/31* (2006.01)
*H01L 23/00* (2006.01)
*H01L 25/18* (2023.01)

(52) U.S. Cl.
CPC .......... *H01L 24/32* (2013.01); *H01L 23/3107* (2013.01); *H01L 24/13* (2013.01);
(Continued)

(58) Field of Classification Search
CPC ...... H01L 23/3107; H01L 24/32; H01L 24/13
See application file for complete search history.

(56) References Cited

U.S. PATENT DOCUMENTS 8,159,067 B2  4/2012  Daubenspeck et al.
9,570,421 B2  2/2017  Wu et al.
(Continued)

FOREIGN PATENT DOCUMENTS

KR  10-2009-0061996   6/2009
KR  10-2011-0123038   11/2011
(Continued)

*Primary Examiner* — Errol V Fernandes
(74) *Attorney, Agent, or Firm* — Morgan, Lewis & Bockius LLP

(57) ABSTRACT

A semiconductor package includes a base chip; semiconductor chips stacked on the base chip; bumps, a lowermost bump of the bumps disposed between the base chip and a lowermost semiconductor chip of the semiconductor chips, and each of the bumps except the lowermost bump respectively disposed between the semiconductor chips; organic material layers, a lowermost organic material layer of the organic material layers disposed between the base chip and the lowermost semiconductor chip, and each of organic material layers except the lowermost organic material layer respectively disposed between the plurality of semiconductor chips; underfill layers respectively surrounding the plurality of bumps, the underfill layers extending between the base chip and the lowermost semiconductor chip and between the semiconductor chips; and an encapsulant covering the base chip, the semiconductor chips, and the underfill layers.

20 Claims, 15 Drawing Sheets

(52) U.S. Cl.
CPC .............. *H01L 24/16* (2013.01); *H01L 24/73* (2013.01); *H01L 24/83* (2013.01); *H01L 25/18* (2013.01); *H01L 2224/13111* (2013.01); *H01L 2224/13113* (2013.01); *H01L 2224/13116* (2013.01); *H01L 2224/13118* (2013.01); *H01L 2224/13139* (2013.01); *H01L 2224/13144* (2013.01); *H01L 2224/13147* (2013.01); *H01L 2224/16145* (2013.01); *H01L 2224/26125* (2013.01); *H01L 2224/32145* (2013.01); *H01L 2224/73204* (2013.01); *H01L 2224/83007* (2013.01)

(56) References Cited

U.S. PATENT DOCUMENTS

| | | |
|---|---|---|
| 9,659,833 B2 | 5/2017 | Lee et al. |
| 10,607,964 B2 | 3/2020 | Fukayama et al. |
| 2005/0230802 A1* | 10/2005 | Vindasius ............. H01L 23/525 257/E21.503 |
| 2007/0178627 A1* | 8/2007 | Jiang ..................... H01L 24/31 438/108 |
| 2009/0155984 A1 | 6/2009 | Kim et al. |
| 2011/0037181 A1* | 2/2011 | Gaynes ................. H01L 23/562 257/E23.116 |
| 2011/0272820 A1 | 11/2011 | Lee et al. |

FOREIGN PATENT DOCUMENTS

| | | |
|---|---|---|
| KR | 10-2006-0041376 | 6/2016 |
| KR | 10-1651272 | 8/2016 |

* cited by examiner

SEMICONDUCTOR PACKAGE INCLUDING A PLURALITY OF SEMICONDUCTOR CHIPS

CROSS-REFERENCE TO RELATED APPLICATION(S)

This application claims priority under 35 U.S.C. § 119 to Korean Patent Application No. 10-2022-0078695, filed on Jun. 28, 2022, in the Korean Intellectual Property Office, the disclosure of which is herein incorporated by reference in its entirety.

TECHNICAL FIELD

The present inventive concept relates to a semiconductor package.

DISCUSSION OF THE RELATED ART

There is a need for weight reduction and high performance of electronic devices, as well as miniaturization and high performance in the semiconductor package field. In order to realize miniaturization, weight reduction, high performance, large capacity, and high reliability of semiconductor packages, research and development of semiconductor packages having a structure in which semiconductor chips are stacked in multiple stages have been ongoing.

SUMMARY

According to an aspect of embodiments of the present inventive concept, a semiconductor package includes a base chip including lower bumps disposed below a lower surface of the base chip; a plurality of semiconductor chips stacked on the base chip, each of the plurality of semiconductor chips having a front surface facing the base chip; a plurality of bumps, a lowermost bump of the plurality of bumps disposed between the base chip and a lowermost semiconductor chip of the plurality of semiconductor chips, and each of the plurality of bumps except the lowermost bump respectively disposed between the plurality of semiconductor chips; a plurality of organic material layers, a lowermost organic material layer of the plurality of organic material layers disposed between the base chip and the lowermost semiconductor chip, and each of the plurality of organic material layers except the lowermost organic material layer respectively disposed between the plurality of semiconductor chips; a plurality of underfill layers respectively surrounding the plurality of bumps, the plurality of underfill layers extending between the base chip and the lowermost semiconductor chip and between the plurality of semiconductor chips; and an encapsulant covering the base chip, the plurality of semiconductor chips, and the plurality of underfill layers. Each of the plurality of semiconductor chips includes a semiconductor substrate, a device layer disposed below the semiconductor substrate, a passivation layer forming the front surface of the each of the plurality of semiconductor chips below the device layer, and front pads disposed below the passivation layer. Each of the plurality of organic material layers extends along an edge region of the front surface of each of the plurality of semiconductor chips and contacts the passivation layer of each of the plurality of semiconductor chips.

According to an aspect of embodiments of the present inventive concept, a semiconductor package includes a plurality of semiconductor chips; a plurality of bumps respectively disposed between the plurality of semiconductor chips; at least one underfill layer surrounding the plurality of bumps and contacting at least a portion of outer side surfaces of the plurality of semiconductor chips, the at least one underfill layer extending between the plurality of semiconductor chips; at least one organic material layer having an upper surface in contact with an edge region of a lower surface of each of the plurality of semiconductor chips and a lower surface in contact with the at least one underfill layer; and an encapsulant covering the at least one underfill layer and the plurality of semiconductor chips.

According to an aspect of embodiments of the present inventive concept, a semiconductor package includes a base chip including lower bumps; a plurality of semiconductor chips disposed on the base chip and each of the plurality of semiconductor chips including a front surface facing the base chip and front pads disposed below the front surface; a plurality of bumps respectively disposed between the base chip and a lowermost semiconductor chip among the plurality of semiconductor chips and between the plurality of semiconductor chips; at least one organic material layer disposed between the plurality of semiconductor chips; at least one underfill layer surrounding the plurality of bumps and the at least one organic material layer and contacting at least a portion of outer side surfaces of the plurality of semiconductor chips; and an encapsulant covering the base chip, the at least one underfill layer, and the plurality of semiconductor chips. The at least one organic material layer is disposed to be horizontally adjacent to an outer side surface of the plurality of semiconductor chips. A minimum width of the at least one organic material layer is greater than a width of each of the front pads.

BRIEF DESCRIPTION OF DRAWINGS

The above and other aspects and features of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1A:
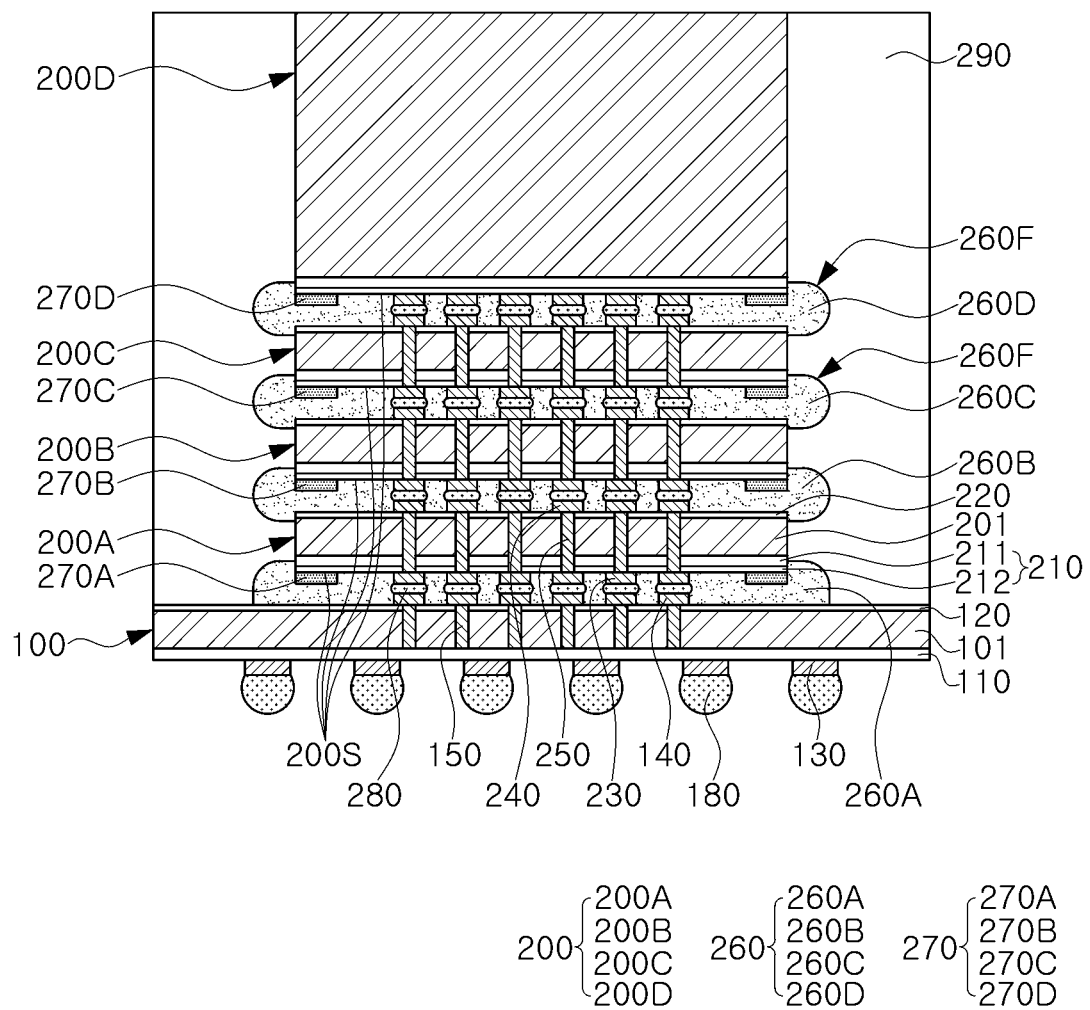
FIG. 1A is a cross-sectional view illustrating a semiconductor package according to an embodiment of the present inventive concept.

FIG. 1A is a cross-sectional view illustrating a semiconductor package according to an embodiment of the present inventive concept.

Figure 1B:
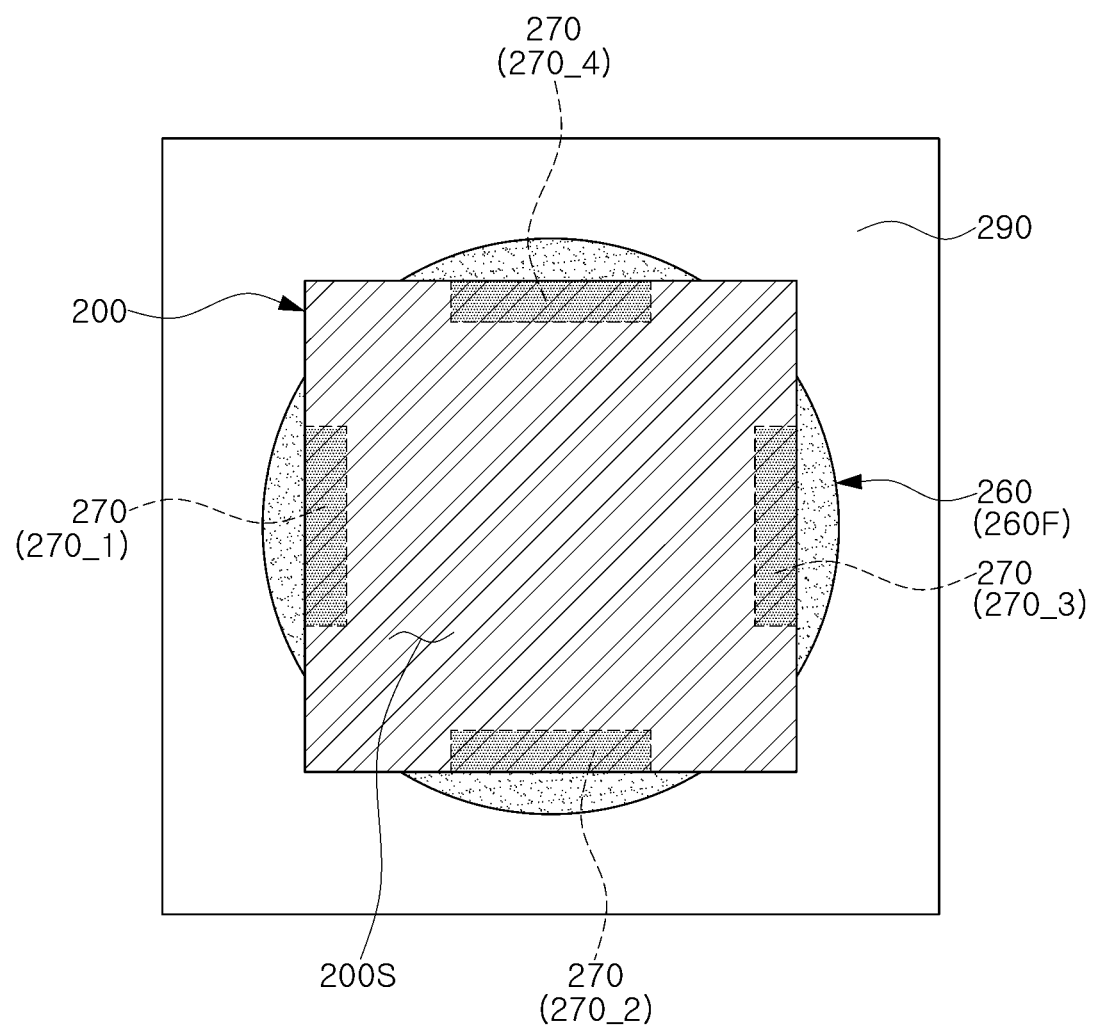
FIG. 1B is a plan view illustrating a semiconductor package according to an embodiment of the present inventive concept.

FIG. 1B is a plan view illustrating a semiconductor package according to an embodiment of the present inventive concept.

Referring to FIGS. 1A and 1B, a semiconductor package 1000A according to an example embodiment may include a base chip 100, a plurality of semiconductor chips 200, a plurality of underfill layers 260, an encapsulant 290, and a plurality of organic material layers 270 in contact with the plurality of semiconductor chips 200. FIG. 1B illustrates a form in which the plurality of semiconductor chips 200, the plurality of underfill layers 260, and the plurality of organic material layers 270 are disposed in a plan view.

The base chip 100 may include a semiconductor material, such as a silicon (Si) wafer. In an embodiment, the base chip 100 may include a first substrate 101, a first front structure 110, a first rear structure 120, first front pads 130, first rear pads 140, and first through-electrodes 150. In some embodiments, first through-electrodes 150 are through-silicon vias (TSVs). TSVs are vertical electrical connections that pass through the body of a silicon wafer or chip. In some cases, TSVs are used to connect different layers of a silicon chip, allowing for more efficient communication between different components on the chip. The front pads 130 are in contact with the base chip 110 and disposed below the base chip 110. The lower bumps 180 are connected to the front pads 130 and disposed below the base chip 110. In some cases, the plurality of semiconductor chips 200 are vertically stacked on the base chip 100, with one semiconductor chip 200 in a vertical level, and the width of the base chip 100 is greater than that of each of the plurality of semiconductor chips 200. In some cases, the plurality of semiconductor chips 200 are disposed within the vertical boundary determined by the base chip 100. In one example, the plurality of semiconductor chips 200 are substantially of the same size, but the disclosure is not necessarily limited thereto.

The base chip 100 may be, for example, a buffer chip including a plurality of logic devices and/or memory devices disposed on the first front structure 110. Accordingly, the base chip 100 may transmit signals from the plurality of semiconductor chips 200 stacked thereon to the outside through the lower bump 180, and may also transmit signals and power from the outside to the plurality of semiconductor chips 200. The base chip 100 may perform a logic function through logic devices and a memory function through memory devices. According to an embodiment, the base chip 100 may include the logic devices and not include the memory device. In one example, the base chip 100 may be an interposer on which the plurality of semiconductor chips 200 are mounted.

The first substrate 101 may include, for example, a semiconductor element, such as silicon (Si) or germanium (Ge), or a compound semiconductor, such as silicon carbide (SiC), gallium arsenide (GaAs), indium arsenide (InAs), or indium phosphide (InP). In some embodiments, the first substrate 101 may have a silicon-on-insulator (SOI) structure. The first substrate 101 may include a conductive region, for example, a well doped with an impurity or a structure doped with an impurity. The first substrate 101 may include various device isolation structures, such as a shallow trench isolation (STI) structure. However, the present disclosure is not necessarily limited to these examples.

The first front structure 110 may be disposed on a lower surface of the first substrate 101 and may include various types of devices. For example, the first front structure 110 may include a field effect transistor (FET), such as a planar FET or a FinFET (FinFET refers to a type of FET that the transistor's channel, through which current flows, is formed by a thin, fin-like structure that protrudes from the surface of the substrate on which the transistor is built), a flash memory, memory devices, such as dynamic random access memory (DRAM), a static random access memory (SRAM), an electrically erasable programmable read-only memory (EEPROM), a phase-change random access memory (PRAM), a magnetoresistive random access memory (MRAM), a ferroelectric RAM (FeRAM), a resistive RAM (RRAM), logic devices such as AND, OR, NOT, etc., various active devices and/or passive devices, such as a system large scale integration (LSI), a CMOS imaging sensor (CIS), and a micro-electro-mechanical system (MEMS).

The first front structure 110 may include interlayer insulating layers and multiple wiring layers, the multiple wiring layers electrically connected to the devices. The multiple wiring layers may be configured to perform functions including electrically connecting the devices disposed on the substrate 101 to one other, electrically connecting the devices to a conductive region of the first substrate 101, or electrically connecting the devices to the lower bumps 180. In one example, the first front structure 110 may be disconnected from the multiple wiring layers by a separate passivation layer including at least one of silicon oxide, silicon nitride, and silicon oxynitride.

The lower bumps 180 may be disposed on the front pads 130 and may be electrically connected to the multiple wiring layers in the first front structure 110 or the first through-electrodes 150. The lower bumps 180 may be formed of, for example, solder balls. However, the present disclosure is not necessarily limited thereto, and the lower bumps 180 may have a structure such as a pillar or a solder. The semiconductor package 1000A may be mounted on an outer substrate, such as a main board, through the lower bumps 180.

The first rear structure 120 may be disposed on an upper surface of the first substrate 101. The first rear structure 120 may face front surfaces of the plurality of semiconductor chips 200. The first rear structure 120 may include a passivation layer protecting the first substrate 101.

The first front pads 130 may be disposed on the first front structure 110, and the first rear pads 140 may be disposed on the first rear structure 120. A first front pad 130 and a corresponding first rear 140 may be electrically connected through the through-electrode 150. The first front pads 130 and the rear pads 140 may include, for example, at least one of aluminum (Al), copper (Cu), nickel (Ni), tungsten (W), platinum (Pt), and gold (Au).

The first through-electrodes 150 may pass through the first substrate 101 in a vertical direction, and may provide an electrical path connecting the first front and rear pads 130 and 140. In some cases, the first through-electrodes 150 may pass through the first rear structure 120. In some cases, the first through-electrodes 150 may not pass through the first front structure 110. One or more of the first through-electrodes 150 may include a conductive plug and a barrier layer surrounding the conductive plug. The conductive plug may include a metal material, for example, tungsten (W), titanium (Ti), aluminum (Al), or copper (Cu). The conductive plug may be formed by a plating process, a PVD process, or a CVD process. PVD stands for Physical Vapor Deposition, and it involves using a physical process to vaporize a material and deposit it onto a substrate. CVD stands for Chemical Vapor Deposition, and it involves using a chemical reaction to deposit a thin film of material onto a substrate. The barrier layer may include an insulating barrier layer and/or a conductive barrier layer. The insulating barrier layer may be formed of an oxide layer, a nitride layer, a carbide layer, a polymer, or combinations thereof. In an example, the conductive barrier layer may be disposed between the insulating barrier layer and the conductive plug. The conductive barrier layer may include, for example, a metal compound, such as tungsten nitride (WN), titanium nitride (TiN), or tantalum nitride (TaN). The barrier layer may be formed by a PVD process or a CVD process.

The plurality of semiconductor chips 200 may be stacked on the base chip 100. Each of the plurality of semiconductor chips 200 may include a second substrate 201, a second front structure 210, and second front pads 230. Each of first to third semiconductor chips 200A, 200B, and 200C, among the plurality of semiconductor chips 200, may include a second rear structure 220, second rear pads 240, and second through-electrodes 250 that are through-silicon vias (TSVs). In some cases, the uppermost semiconductor chip 200D may have a different structure compared with each of first to third semiconductor chips 200A, 200B, and 200C, and the uppermost semiconductor chip 200D may not include a second rear structure 220, second rear pads 240, and second through-electrodes 250. The plurality of semiconductor chips 200 may be electrically connected to one other through a plurality of bumps 280 respectively disposed below the plurality of semiconductor chips 200. In some cases, the plurality of semiconductor chips 200 may include a lowermost semiconductor chip. In some cases, a bump 280 may be disposed between a first rear pad 140 and a second front pad 230. In some cases, a lowermost bump of a plurality of bumps 280 may be disposed between the base chip 100 and a lowermost semiconductor chip 200A of the plurality of semiconductor chips 200, and each of the plurality of bumps 280 except the lowermost bump may be respectively disposed between the plurality of semiconductor chips 200. According to embodiments, the second substrate 201 may have a structure and function similar to those of the first substrate 101, therefore the first substrate 101 may also refer to the second substrate 201 in this disclosure.

The second front structure 210 may include a device layer 211 and a passivation layer 212. The device layer 211 may include a plurality of memory devices. For example, the device layer 211 may include volatile memory devices, such as DRAM and SRAM, or non-volatile memory devices, such as PRAM, MRAM, FeRAM, or RRAM. For example, DRAM devices may be disposed on the device layers 211 of the plurality of semiconductor chips 200. Accordingly, the semiconductor package 1000A may be used for a high bandwidth memory (HBM) product, or an electro data processing (EDP) product. The device layer 211 may include interlayer insulating layers and multiple wiring layers, the multiple wiring layers 211 electrically connected to the memory devices in the device layer 211. In some cases, the multiple The memory devices of the device layer 211 may be electrically connected to the plurality of bumps 280 through the multiple wiring layers 211. The passivation layer 212 may be disposed between the front pads 230 and the device layer 211. The passivation layer 212 may also be disposed between the organic material layer 270 and the device layer 211. The passivation layer 212 may include at least one of silicon oxide, silicon nitride, and silicon oxynitride. The passivation layer 212 may include a first region in which the front pads 230 are disposed and a second region surrounding the first region, and the organic material layer 270 may be in contact with the second region of the passivation layer 212.

In one example, the base chip 100 may include a plurality of logic devices and/or memory devices in the first front structure 110, and may be referred to as a buffer chip or a control chip, etc. The plurality of semiconductor chips 200 may include a plurality of memory devices in the second front structure 210, respectively, and may be referred to as core chips. Additionally or Alternatively, the base chip 100 may be referred to as a first semiconductor chip, and the semiconductor chip 200 may be referred to as a second semiconductor chip.

The plurality of semiconductor chips 200 may include a first semiconductor chip 200A, a second semiconductor chip 200B, a third semiconductor chip 200C, and a fourth semiconductor chip 200D, where 200A, 200B, 200C, and 200D are sequentially stacked on the base chip 100. In some cases, a passive layer 212 may be disposed between each of the organic material layers 270A, 270B, 270C, and 270D and a corresponding device layer 211. In some cases, a passive layer 212 may be disposed between each of the organic material layers 270A, 270B, 270C, and 270D and a corresponding device layer 211. In some cases, the plurality of organic material layers 270 may include a lowermost organic material layer 270A. In some cases, the lowermost organic material layer 270A of the plurality of organic material layers 270 may be disposed between the base chip 100 and the lowermost semiconductor chip 200A, and each of the plurality of organic material layers 270 except the lowermost organic material layer 270A is respectively disposed between the plurality of semiconductor chips 200. In some cases, the fourth semiconductor chip 200D may have a thickness greater than that of each of the first to third semiconductor chips 200A, 200B, and 200C, but the present disclosure is not necessarily limited thereto. In some cases, the fourth semiconductor chip 200D may not include the rear pads 240 or the second through-electrodes 250. The number of chips included in the plurality of semiconductor chips 200 is not necessarily limited to that shown in the drawings, and may be variously changed according to embodiments.

The plurality of bumps 280 may be disposed between a lower semiconductor chip (e.g., the rear pad 240 of the first semiconductor chip 200A), among the plurality of semiconductor chips 200, and an upper semiconductor chip (e.g., the front pad 230 of the second semiconductor chip 200B), among the plurality of semiconductor chips 200. The plurality of bumps 280 may be disposed between the first semiconductor chip 200A and the base chip 100. The plurality of bumps 280 may electrically connect the plurality of semiconductor chips 200 and the base chip 100. The plurality of bumps 280 may include, for example, solder, but the present disclosure might not necessarily be limited thereto and the plurality of bumps 280 may include both a pillar and solder according to an embodiment. The pillar has a cylindrical or polygonal column shape, such as a square or octagonal column, and may include, for example, nickel (Ni), copper (Cu), palladium (Pd), platinum (Pt), gold (Au) or combinations thereof. The solder has a spherical or ball shape and may include, for example, tin (Sn), indium (In), bismuth (Bi), antimony (Sb), copper (Cu), silver (Ag), zinc (Zn), lead (Pb), and/or alloys thereof. The alloys may include, for example, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, etc. A height of the plurality of bumps 280 may be determined according to wetting of solder in a reflow process.

The plurality of underfill layers 260 may be disposed on a lower surface 200S of each of the plurality of semiconductor chips 200. The underfill layer 260 may be disposed between the base chip 100 and the lowermost first semiconductor chip 200A among the plurality of semiconductor chips 200. The underfill layer 260 may be disposed between the plurality of semiconductor chips 200 to surround side surfaces of the plurality of bumps 280. In some cases, the plurality of underfill layers 260 extend to fill spaces between devices on the substrate 101. The plurality of underfill layers 260 may fix the plurality of semiconductor chips 200 on the base chip 100. The plurality of underfill layers 260 may surround the plurality of bumps 280 and the plurality of organic material layers 270 and extend to a side surface of the semiconductor chip 200 adjacent to the lower surface 200S of the semiconductor chip 200. The lower surface 200S is a lower end portion of the side surface of the semiconductor chip 200. The underfill layer 260 may include an underfill inner portion vertically overlapping the semiconductor chip 200 and an underfill outer portion 260F protruding to an outside of the underfill inner portion. The underfill outer portion 260F may protrude out of a region overlapping the semiconductor chip 200 to cover at least a portion of a side surface of the semiconductor chip 200. The underfill outer portion 260F may contact an outer side surface of the organic material layer 270. In one example, the underfill outer portion 260F may be referred to as a fillet portion. The degree and shape of the protruding of the underfill outer portion 260F may vary depending on process conditions, for example, conditions of a thermal compression process. The underfill layer 260 may be a non-conductive film (NCF), but is not necessarily limited thereto. The underfill layer 260 may include at least one of an epoxy resin, silica ($SiO_2$), and an acrylic copolymer, or combinations thereof.

The plurality of underfill layers 260 may include a first underfill layer 260A between the base chip 100 and the first semiconductor chip 200A, a second underfill layer 260B between the first semiconductor chip 200A and the second semiconductor chip 200B, a third underfill layer 260C between the second semiconductor chip 200B and the third semiconductor chip 200C, and a fourth underfill layer 260D between the third underfill layer 260C and the fourth semiconductor chip 200D. One or more of the underfill outer portions 260F of the first, second, third, and fourth underfill layers 260A, 260B, 260C, and 260D may be different in shapes of side surfaces. For example, the shape of the side surface of the first underfill layer 260A may be different from the shape of the side surfaces of the second, third, and fourth underfill layers 260B, 260C, and 260D. For example, the underfill outer portions 260F of the second and third underfill layers 260B and 260C may protrude more than the underfill outer portion 260F of the fourth underfill layer 260D.

Each of the plurality of organic material layers 270 may contact the lower surface 200S of a corresponding semiconductor chip 200. For example, the organic material layer 270B may contact the bottom surface 200S of the semiconductor chip 200B. An outer side surface of the plurality of organic material layers 270 may be in contact with the underfill outer portion 260F of the underfill layer 260, and a lower surface of the plurality of organic material layers 270 may be in contact with the underfill inner portion of the underfill layer 260. An outer side surface of at least one of the plurality of organic material layers 270 may be substantially coplanar with an outer side surface of at least one of the plurality of semiconductor chips 200. The plurality of organic material layers 270 may be spaced apart from the encapsulant 290 and may be horizontally spaced apart from the front pads 230 disposed on the same level. The plurality of organic material layers 270 may be in contact with the passivation layer 212. A thickness of the organic material layer 270 may range from about 200 nm to about 500 nm. The thickness of the organic material layer 270 may be substantially the same as the thickness of the front pad 230. In one example, the organic material layer 270 may be thicker or thinner than the front pad 230. A minimum width of the organic material layer 270 may be greater than the width of the front pads 230.

As shown in FIG. 1B, the organic material layer 270 may be disposed, in a horizontal plane, at the center of an edge region of the lower surface 200S, which is the front surface of the semiconductor chip 200. For example, the organic material layer 270 may intermittently extend along the edge region of the lower surface 200S of the semiconductor chip 200. In a plan view, the organic material layer 270 may partially cover the edge region of the lower surface 200S of the semiconductor chip 200. The edge region may refer to a region including each side of the quadrangular-shaped lower surface 200S of the semiconductor chip 200 in a plan view. For example, the organic material layer 270 may include first, second, third and fourth organic material patterns 270_1, 270_2, 270_3, and 270_4, the organic material patterns disposed on four edge regions of the lower surface 200S of the semiconductor chip 200, respectively. In some cases, the first, second, third, and fourth organic material patterns 270_1, 270_2, 270_3, and 270_4 may be spaced apart from one other. In some cases, the first, second, third, and fourth organic material patterns 270_1, 270_2, 270_3, and 270_4 may not extend to or beyond a corner region of the semiconductor chip 200.

The plurality of organic material layers 270 may include a first organic material layer 270A in contact with the edge region of the lower surface 200S of the first semiconductor chip 200A, a second organic material layer 270B in contact with the edge region of the lower surface 200S of the second semiconductor chip 200B, a third organic material layer 270C in contact with the edge region of the lower surface 200S of the third semiconductor chip 200C, and a fourth organic material layer 270D in contact with the edge region of the lower surface 200S of the fourth semiconductor chip 200D. As shown in FIG. 1B, in the plain view, the respective organic material layers 270A, 270B, 270C, and 270D may include first, second, third, and fourth organic material patterns 270_1, 270_2, 270_3, and 270_4 disposed in four edge regions spaced apart from each other.

The organic material layer 270 may include a material different from that of the passivation layer 212. The organic material layer 270 may be formed of various organic materials that may be applied by a spin coating method. For example, the organic material layer 270 may include an organic material, such as photosensitive polyimide (PSPI).

The organic material layer 270 may increase adhesion between the semiconductor chips 200 and the underfill layers 260. A terminal configuration of the semiconductor chips 200 is a passivation layer 212, and the interface between the passivation layer 212 and the underfill layer 260 is vulnerable to vapor pressure and thermal stress, so that delamination may occur. When the underfill layers 260 are reflowed through a thermal compression bonding process, the edge regions of the lower surfaces 200S of the semiconductor chips 200 are more vulnerable to such delamination. According to an embodiment of the inventive concept, by disposing the organic material layer 270 in the region vulnerable to delamination, an interfacial delamination phenomenon between the semiconductor chip 200 and the underfill layer 260 may be suppressed. Accordingly, the reliability of the semiconductor package may be increased.

The encapsulant 290 is disposed on the base chip 100, and may cover a portion of an upper surface of the base chip 100 and side surfaces of the plurality of underfill layers 260. The encapsulant 290 may cover a portion of side surfaces of the plurality of semiconductor chips 200. As shown in FIG. 1A, the encapsulant 290 may not cover at least a portion of the upper surface of the fourth semiconductor chip 200D, and the upper surface of the fourth semiconductor chip 200D may be at least partially exposed from the encapsulant 290. In one example, the encapsulant 290 may have a predetermined thickness in the vertical direction and cover the entire upper surface of the fourth semiconductor chip 200D. The encapsulant 290 may include an insulating material, for example, an epoxy molding compound (EMC).

Figure 2:
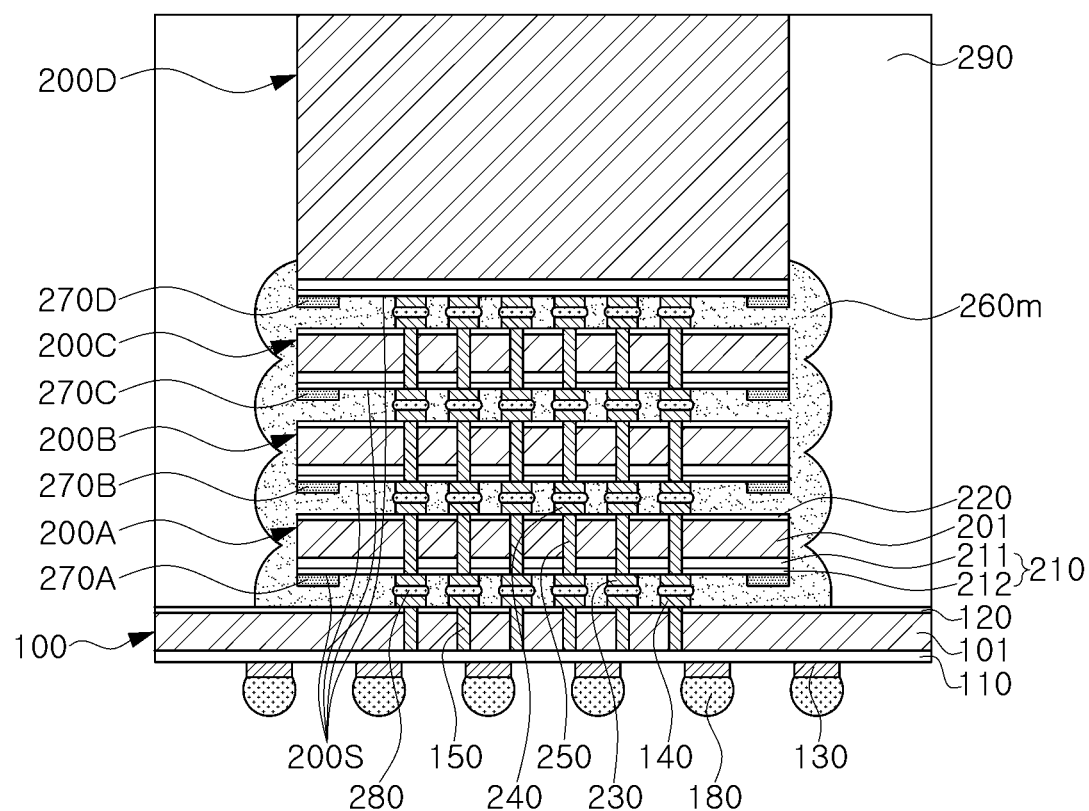
FIG. 2 is a cross-sectional view illustrating a semiconductor package according to an embodiment of the present inventive concept.

FIG. 2 is a cross-sectional view illustrating a semiconductor package according to an embodiment of the present inventive concept.

Referring to FIG. 2, in a semiconductor package 1000B according to an embodiment. The underfill outer portions protruding outwardly between the semiconductor chips 200 may be combined to form a single underfill layer 260m. An outer side surface of the underfill layer 260m may have a concavo-convex shape, for example, a wavy pattern.

FIGS. 3A to 3D are plan views illustrating a semiconductor package according to an embodiment of the present inventive concept.

Figure 3A:
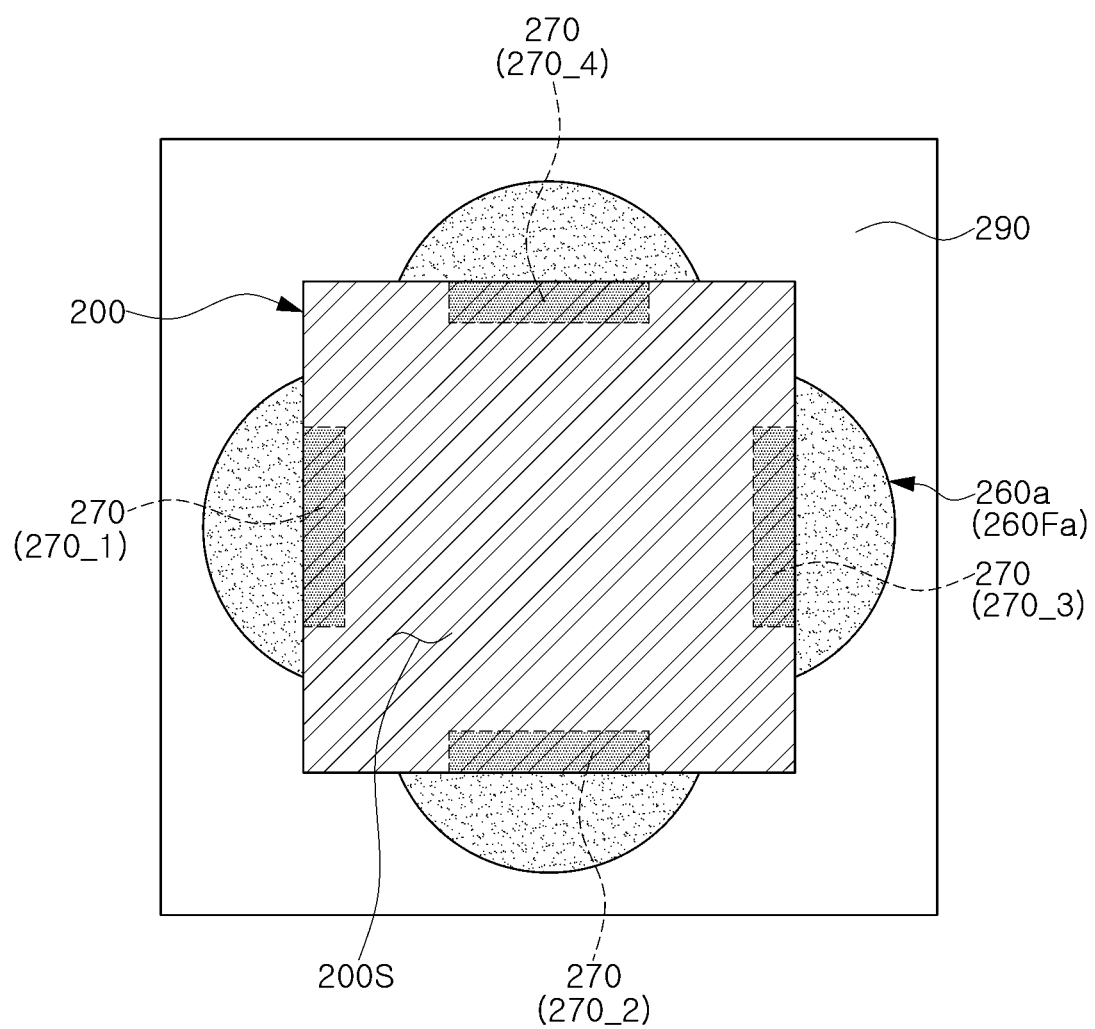
FIGS. 3A to 3D are plan views illustrating a semiconductor package according to an embodiment of the present inventive concept.

Referring to FIG. 3A, an underfill outer portion 260Fa of an underfill layer 260a may be further pushed out of the plurality of organic material layers 270 by the plurality of organic material layers 270. Accordingly, the underfill outer portion 260Fa of the underfill layer 260a of FIG. 3A may further protrude from the outer side surface of the semiconductor chip 200. In some cases, the underfill outer portion 260Fa may convexly protrude from an edge region of the lower surface 200S of the semiconductor chip 200.

Figure 3B:
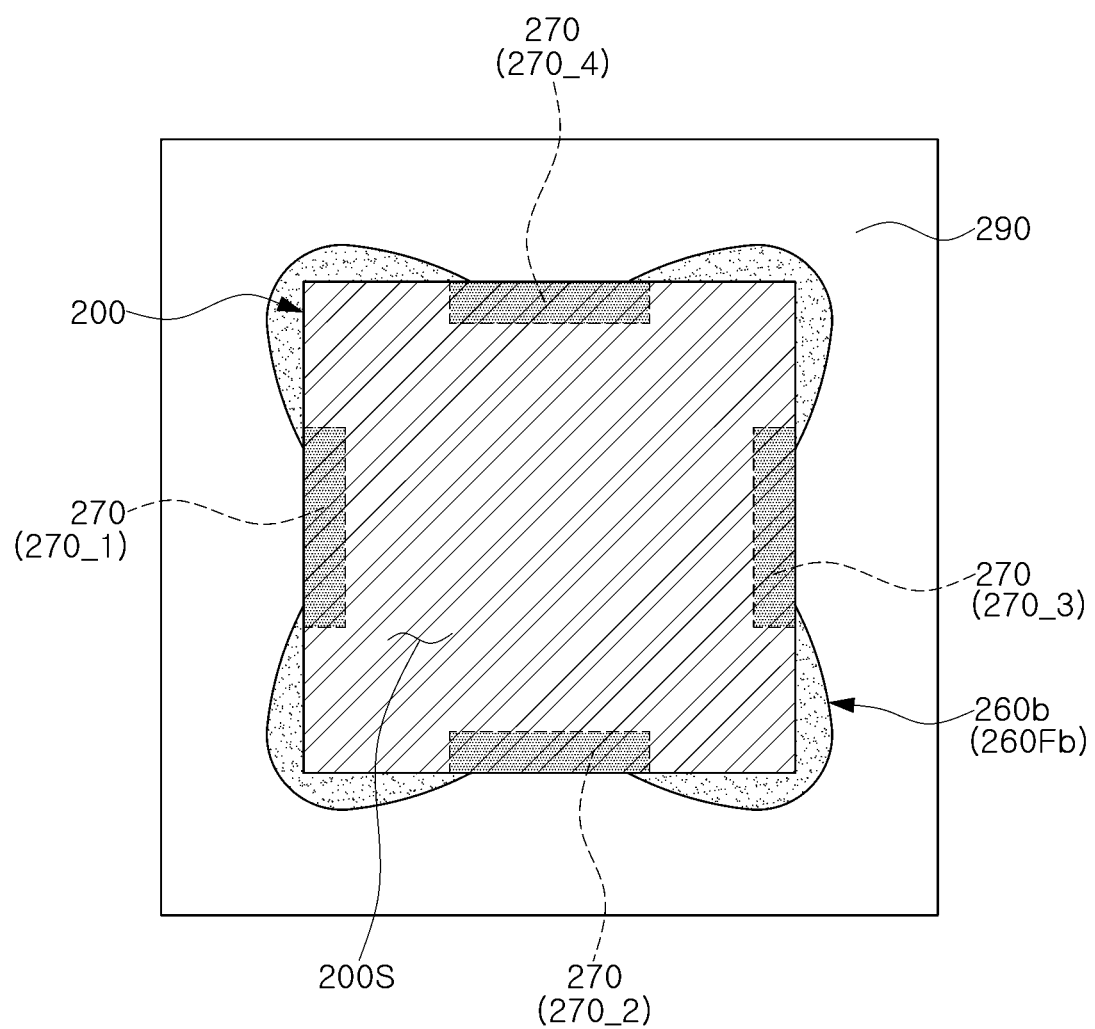

Referring to FIG. 3B, reflow of an underfill outer portion 260Fb of the underfill layer 260b is suppressed by the organic material layer 270 so that the underfill outer portion 260Fb may further convexly protrude along the directions pointing to the corner regions of the lower surface 200S of the semiconductor chip 200, forming a convex shape on each side of the semiconductor chip 200.

Figure 3C:
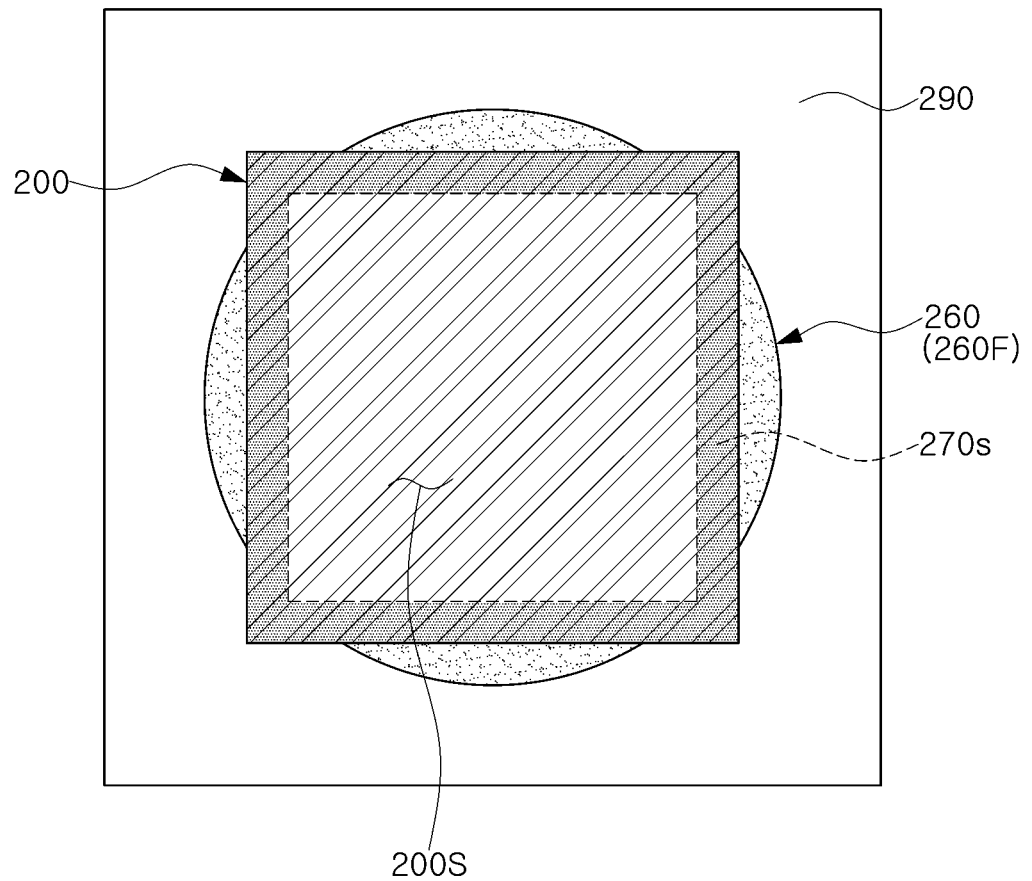

Referring to FIG. 3C, an organic material layer 270s may extend along a quadrangular border of the lower surface 200S of the semiconductor chip 200 in a plan view. That is, when taking a top-down view of the organic material layer 270, the organic material layer 270s may have the shape of a square ring.

Figure 3D:
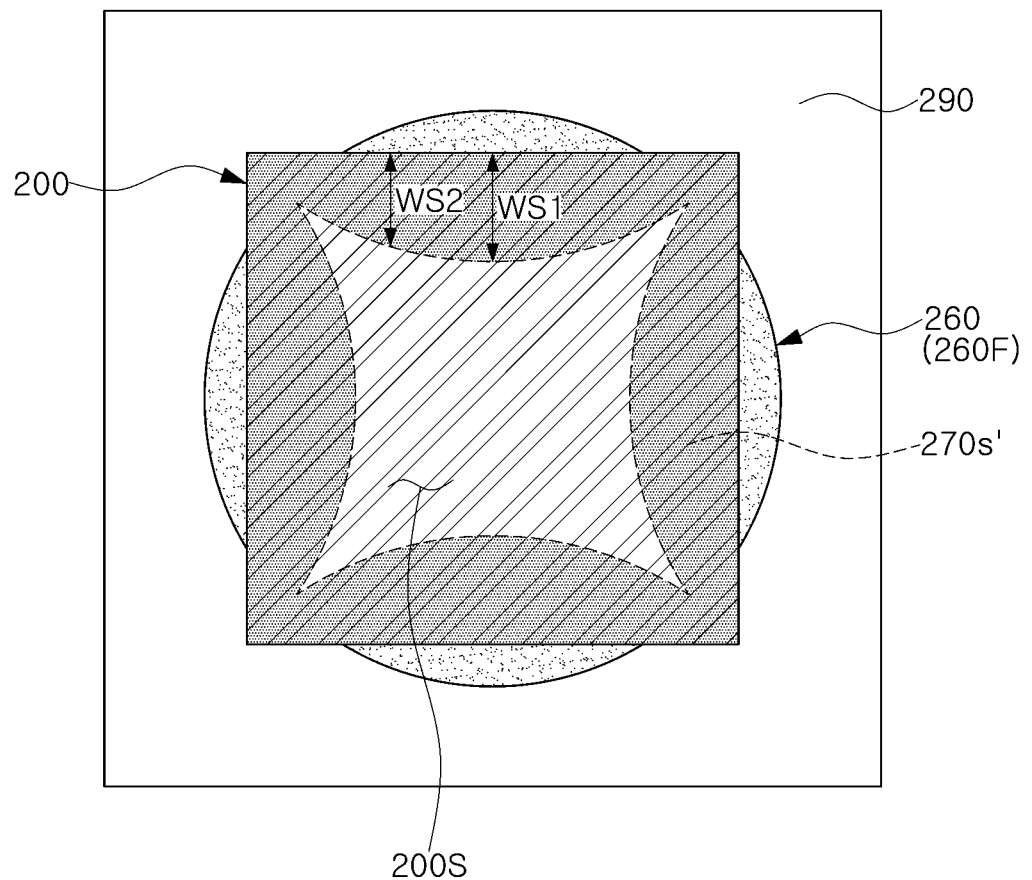

Referring to FIG. 3D, the organic material layer 270s' may extend along a quadrangular border of the lower surface 200S of the semiconductor chip 200 in a plan view, and may include a portion having a different width in one direction in at least one edge region. For example, the organic material layer 270s' may have a first width WS1 in a center region of an edge region of the lower surface 200S of the semiconductor chip 200 and a second width WS2 in a region away from the center region, and the second width WS2 may be smaller than the first width WS1.

Figure 4:
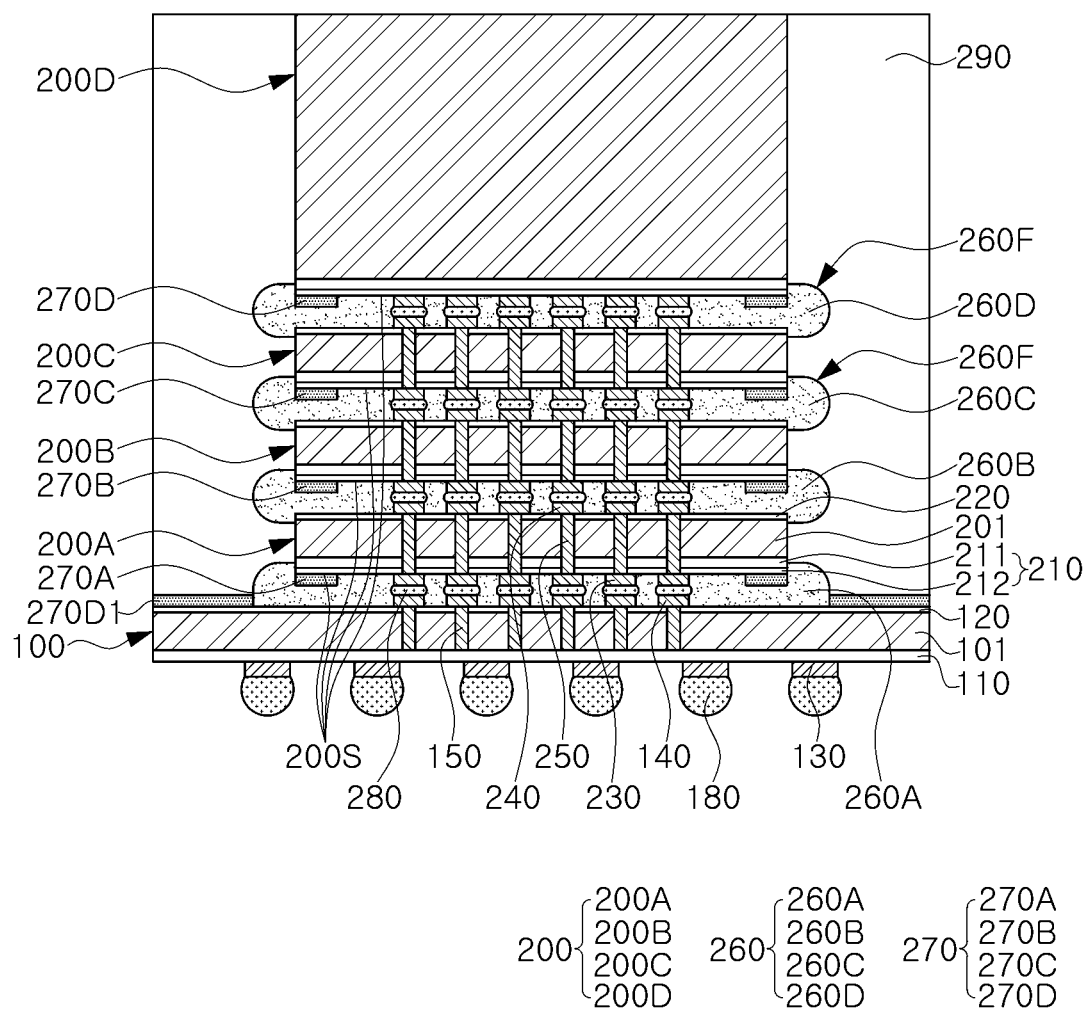
FIG. 4 is a cross-sectional view illustrating a semiconductor package according to an embodiment of the present inventive concept.

FIG. 4 is a cross-sectional view illustrating a semiconductor package according to an embodiment of the present inventive concept.

Referring to FIG. 4, a semiconductor package 1000C according to an embodiment may further include a first lower organic material layer 270D1 covering a portion of the upper surface of the base chip 100. The first lower organic material layer 270D1 may be in contact with the first underfill layer 270A and may be disposed to surround the first underfill layers 270A. The first lower organic material layer 270D1 may be in contact with an edge region of the upper surface of the base chip 100. The first lower organic material layer 270D may increase adhesion between the base chip 100 and the encapsulant 290 and may suppress a delamination phenomenon that may occur at the interface between the base chip 100 and the encapsulant 290.

Figure 5:
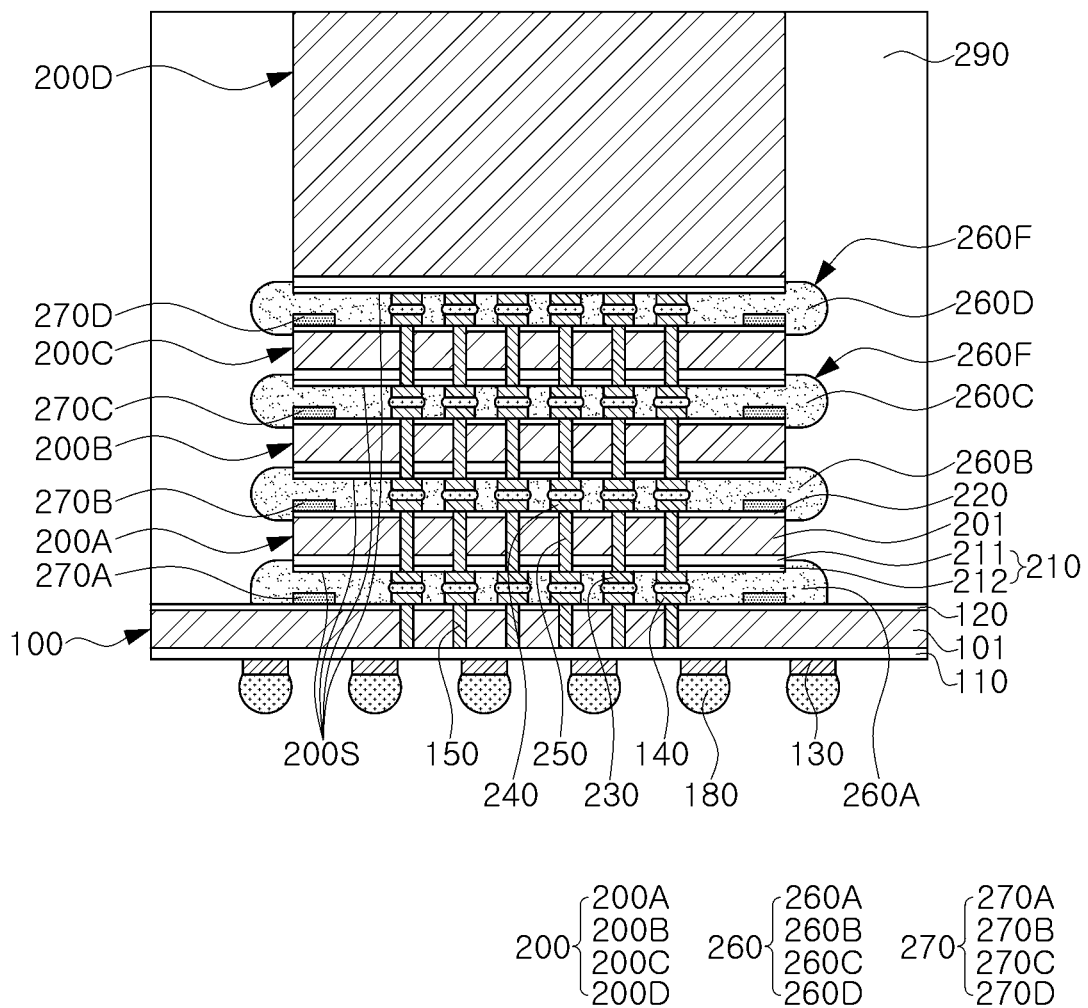
FIG. 5 is a cross-sectional view illustrating a semiconductor package according to an embodiment of the present inventive concept.

FIG. 5 is a cross-sectional view illustrating a semiconductor package according to an embodiment of the present inventive concept.

Referring to FIG. 5, in a semiconductor package 1000D according to an example embodiment, a plurality of organic material layers 270 may be disposed to contact an edge region of an upper surface of each semiconductor chip 200. For example, the plurality of organic material layers 270 may be disposed to be in contact with the upper surface of the base chip 100, and may be disposed to contact the edge region of the upper surface of each of the first to third semiconductor chips 200A, 200B, and 200C, among the plurality of semiconductor chips 200. The plurality of organic material layers 270 may increase adhesion between the plurality of semiconductor chips 200 and the plurality of underfill layers 260 and suppress an interfacial delamination phenomenon, thereby improving the reliability of the semiconductor package 1000D.

Figure 6:
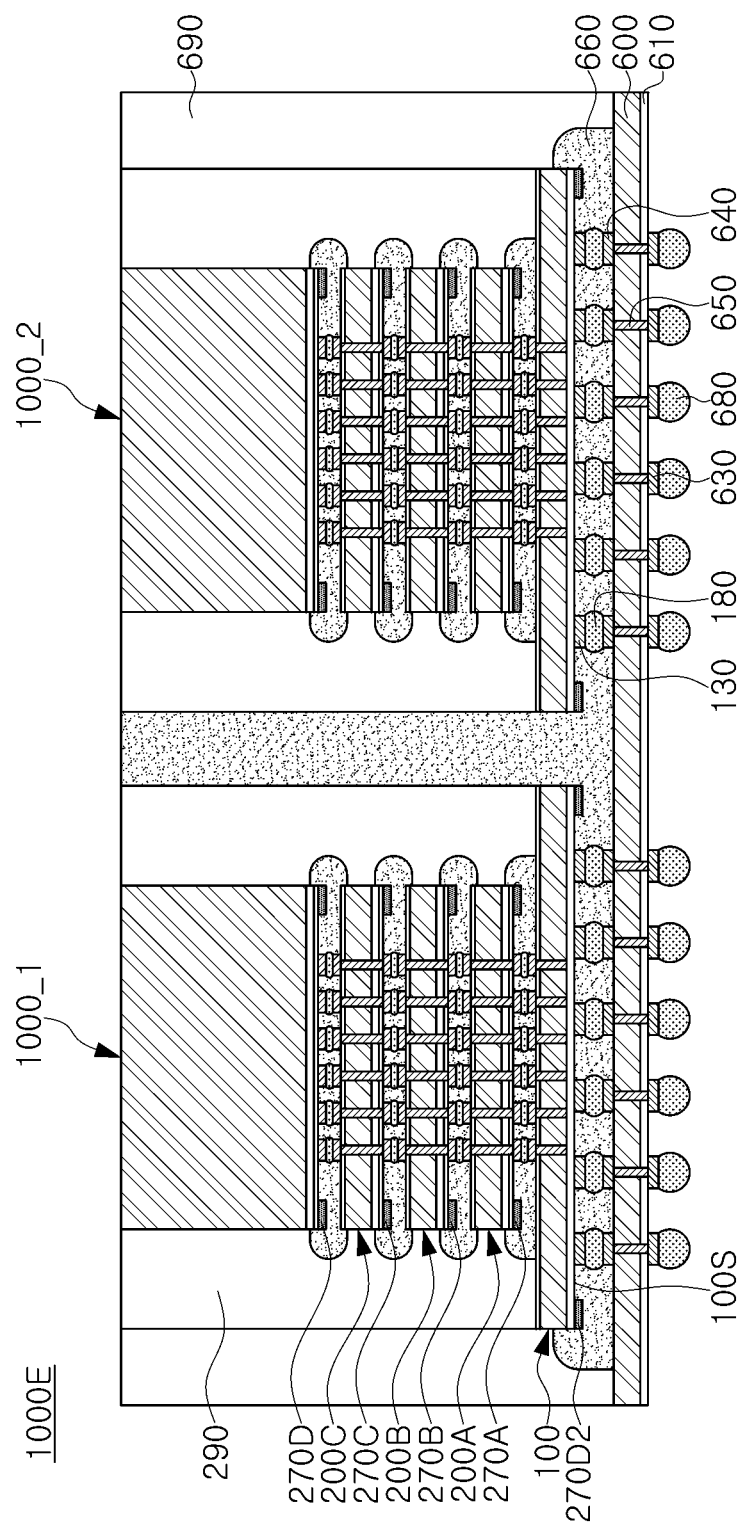
FIG. 6 is a cross-sectional view illustrating a semiconductor package according to an embodiment of the present inventive concept.

FIG. 6 is a cross-sectional view illustrating a semiconductor package according to an embodiment of the present inventive concept.

Referring to FIG. 6, a semiconductor package 1000E according to an embodiment may include an interposer substrate 600, an interposer underfill layer 660, a second lower organic material layer 270D2 in contact with the edge region of the lower surface 100S of the base chip 100, and an interposer encapsulant 690. At least two semiconductor packages 1000A shown in FIG. 1A may be disposed side by side on the interposer substrate 600, and hereinafter, the two semiconductor packages 1000A will be referred to as a first chip structure 1000_1 and a second chip structure 1000_2, respectively.

The interposer substrate 600 may include a semiconductor substrate 601, a lower protective layer 610, a lower pad 630, an upper pad 640, an interposer bump 680, and an interposer through-electrode 650. The interposer substrate 600 may be disposed on a package substrate disposed below the interposer substrate 600. The package substrate may be a substrate for a semiconductor package including a printed circuit board (PCB), a ceramic substrate, a glass substrate, a tape wiring board, and the like. In one example, the interposer substrate 600 may include multiple wiring layers electrically connected to the interposer through-electrodes 650.

The semiconductor substrate 601 may include, for example, silicon (Si). Accordingly, the interposer substrate 600 may be referred to as a silicon interposer.

A lower passivation layer 610 may be disposed on a lower surface of the semiconductor substrate 601, and a lower pad 630 may be disposed on the lower passivation layer 610. The lower pad 630 may be electrically connected to the through-electrode 650. The lower pad 630 may be in contact with the through-electrode 650. The chip structures 1000_1 and 1000_2 may be electrically connected to the package substrate through interposer bumps 680 disposed on the lower pad 630.

The interposer through-electrode 650 may extend from the upper surface to the lower surface of the substrate 601 in a vertical direction to pass through the semiconductor substrate 601. According to an embodiment, the interposer substrate 600 may include only a wiring layer therein, but may not include an interposer through-electrode.

The interposer bump 680 may be disposed on a lower surface of the interposer substrate 600 and may be electrically connected to the multiple wiring layers inside the interposer substrate 600.

The interposer underfill layer 660 may extend between the chip structures 1000_1 and 1000_2 to surround the lower bumps 180 between the chip structures 1000_1 and 1000_2 and the interposer substrate 600. In some cases, the interposer underfill layer 660 may fill the space between the chip structures 1000_1, 1000_2 and the lower bumps 180. The interposer underfill layer 660 may surround the second lower organic material layer 270D2 and may cover at least a portion of a side surface of the base chip 100 of each of the chip structures 1000_1 and 1000_2.

The second lower organic material layer 270D2 may be in contact with an edge region of the lower surface 100S of the base chip 100. The second lower organic material layer 270D2 may increase adhesion between the base chip 100 and the interposer underfill layer 660 and suppress interfacial delamination, thereby improving the reliability of the semiconductor package 1000D.

The interposer encapsulant 690 may be disposed on the interposer substrate 600 and may cover the interposer underfill layer 660 and the chip structures 1000_1 and 1000_2. The interposer encapsulant 690 may include an insulating material, for example, an epoxy molding compound (EMC).

Figure 7A:
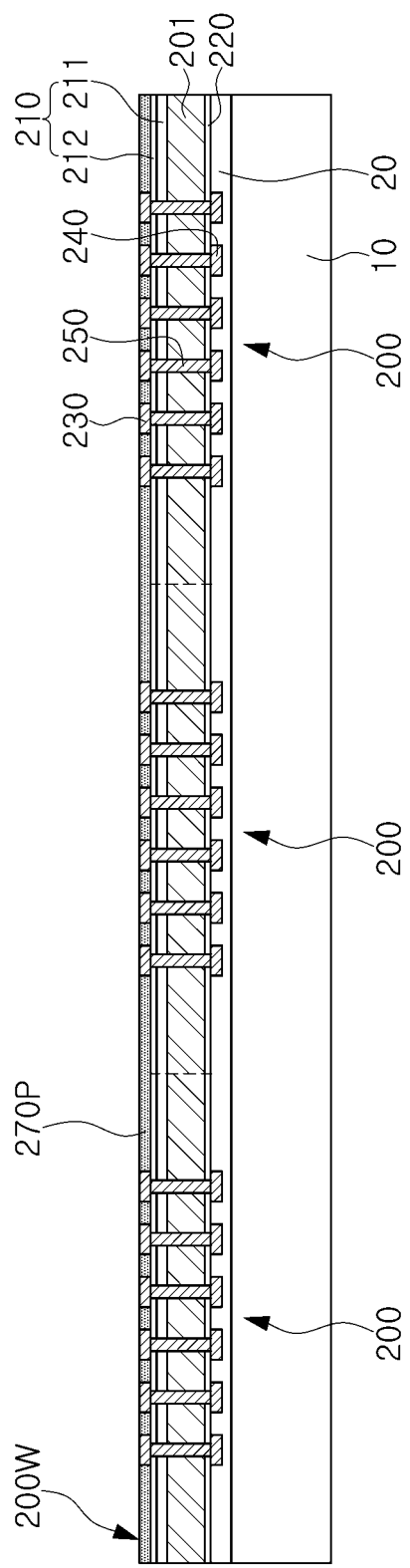
FIGS. 7A to 7C are cross-sectional views illustrating a sequential process of manufacturing semiconductor chips according to an example embodiment of the present inventive concept.
Figure 7B:
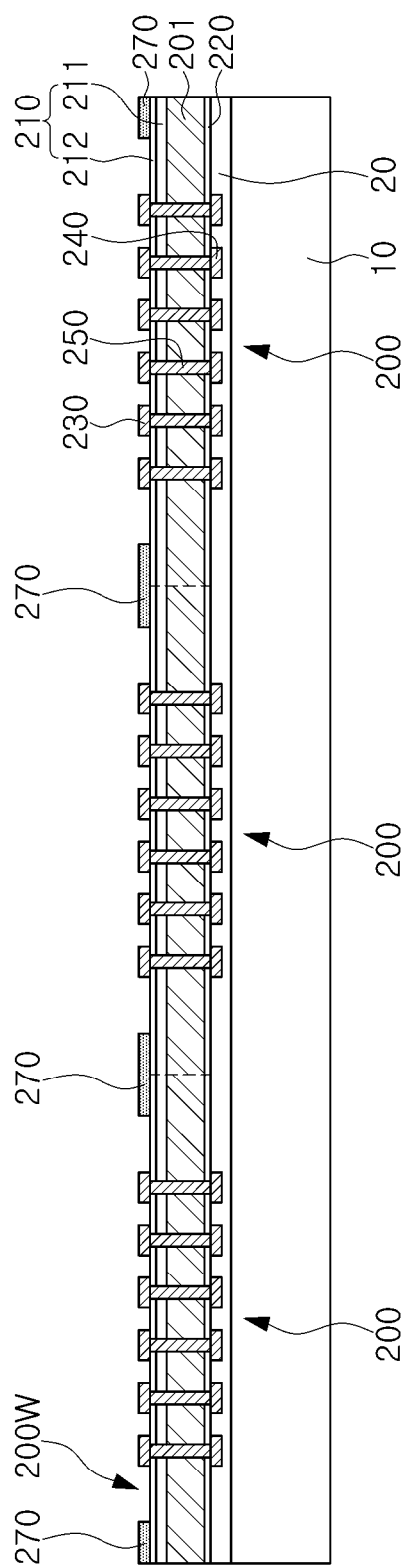
Figure 7C:
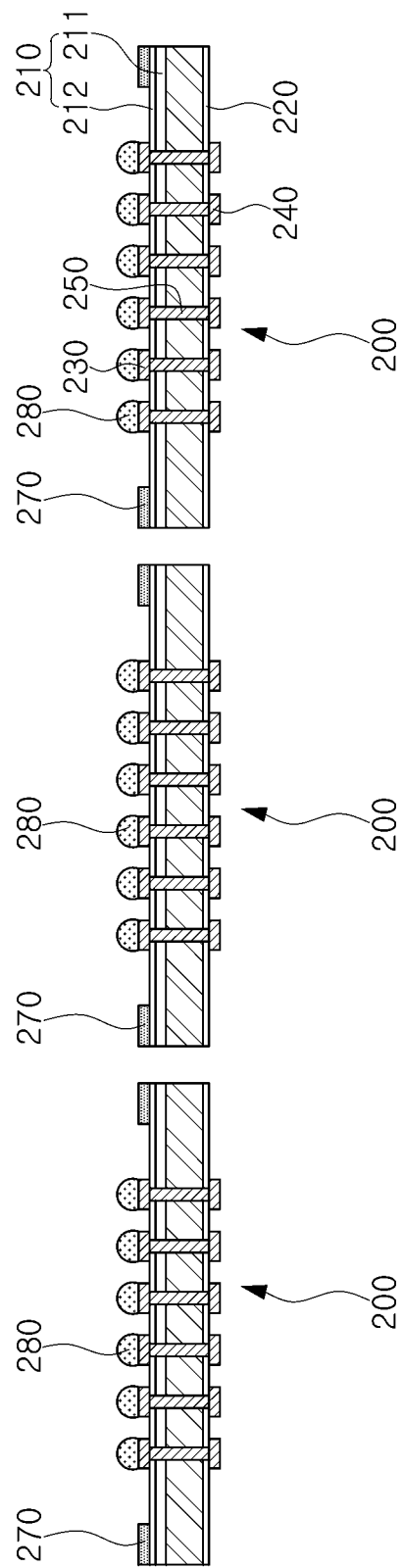

FIGS. 7A to 7C are cross-sectional views illustrating a sequential process of manufacturing semiconductor chips according to an example embodiment of the present inventive concept.

Referring to FIG. 7A, a semiconductor wafer 200W for the semiconductor chips 200 having the through-electrodes 250 may be attached to a carrier 10 using an adhesive material layer 20. The semiconductor wafer 200W may be in a state where components for the semiconductor chips 200 have been implemented. The semiconductor chips 200 may include scribe lanes (indicated by the dotted region in FIG. 7A) in the semiconductor wafer 200W. The semiconductor wafer 200W may be attached on the carrier 10 such that the lower surfaces of the semiconductor chips 200 on which the rear pads 240 are disposed face the adhesive material layer 20. The rear pads 240 may be covered by the adhesive material layer 20, and the lower surface of the semiconductor wafer 200W may be in contact with the upper surface of the adhesive material layer 20. An organic material layer 270P may be formed on the semiconductor wafer 200W. The organic material layer 270P may be formed through, for example, spin coating.

Referring to FIG. 7B, a portion of the organic material layer 270P may be removed through a photolithography process and an etching process, and a patterned organic material layer 270 may be formed. In some cases, the organic material layer 270 includes photosensitive polyimide (PSPI), and the organic material layer 270 may be precisely patterned. The organic material layer 270 may remain in the edge region of the surface of each of the semiconductor chips 200 through a photolithography process and an etching process.

Referring to FIG. 7C, the semiconductor wafer 200W may be cut along the scribe line to be separated into a plurality of semiconductor chips 200. Bumps 280 may be formed on the plurality of semiconductor chips 200. The adhesive material layer 20 and carrier 10 may be removed.

FIGS. 8A to 8D are cross-sectional views illustrating a sequential process of manufacturing a semiconductor package according to an embodiment of the present inventive concept.

Figure 8A:
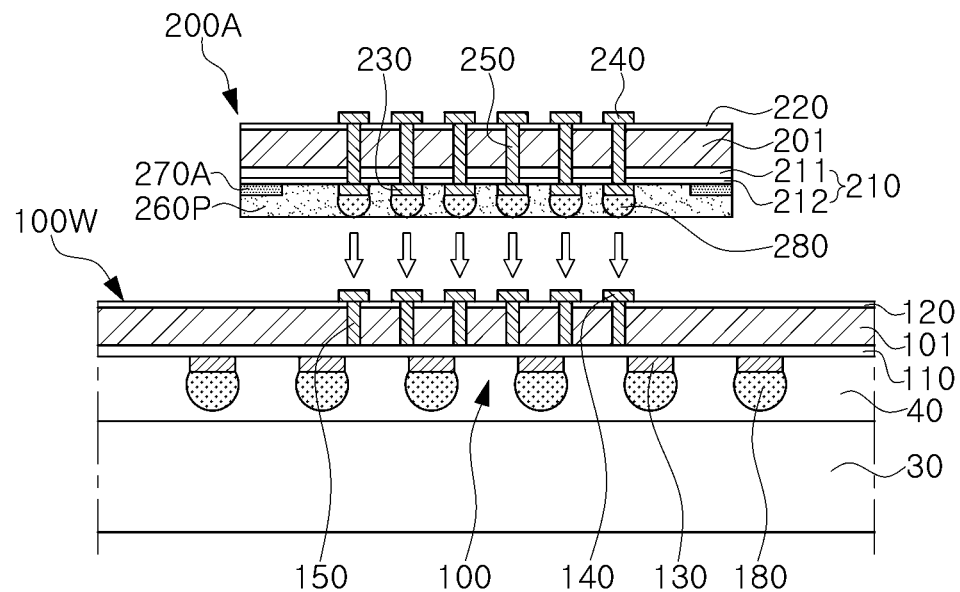
FIGS. 8A to 8D are cross-sectional views illustrating a sequential process of manufacturing a semiconductor package according to an embodiment of the present inventive concept.

Referring to FIG. 8A, a semiconductor wafer 100W for the base chip 100 may be prepared, and the first semiconductor chip 200A manufactured in FIGS. 7A to 7C may be attached to the semiconductor wafer 100W. The semiconductor wafer 100W may be in a state where components for the base chip 100 have been implemented. The semiconductor wafer 100W may be attached to a carrier 30 using an adhesive material layer 40. The bumps 280 of the first semiconductor chip 200A may be attached to the semiconductor wafer 100W, while being aligned with the first rear pads 140 of the base chip 100. The first semiconductor chip 200A may be attached to the semiconductor wafer 100W in a state in which an adhesive film 260P covering the plurality of bumps 280 and the organic material layers 270A are formed on the lower surface of the first semiconductor chip 200A.

Figure 8B:
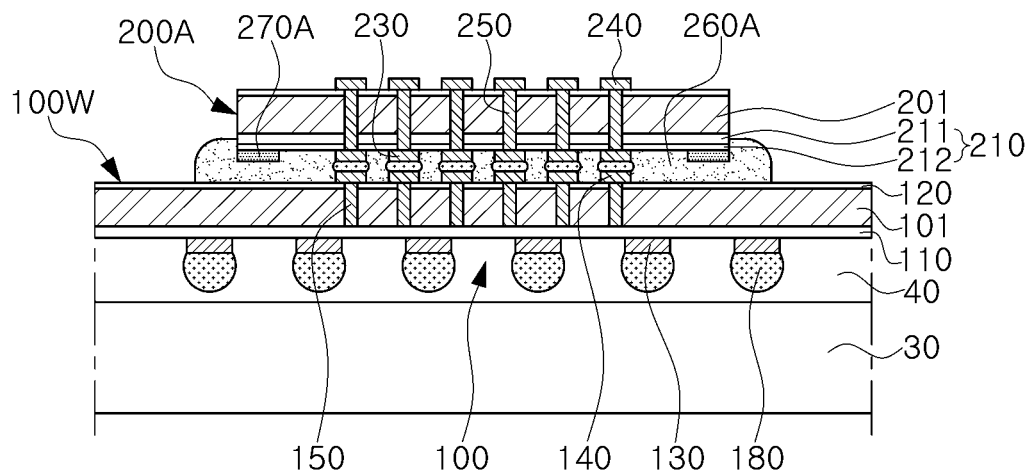

Referring to FIG. 8B, by performing a thermal compression (TC) process on the first semiconductor chip 200A to which the adhesive film 260P is attached, the first semiconductor chip 200A may be bonded to the semiconductor wafer 100W for the base chip 100. While the thermal compression bonding process is performed, the adhesive film 260P may be reflowed and cured to form the first underfill layer 260A. In this case, an underfill outer portion protruding outwardly from a portion interposed between the base chip 100 and the first semiconductor chip 200A may be formed.

Figure 8C:
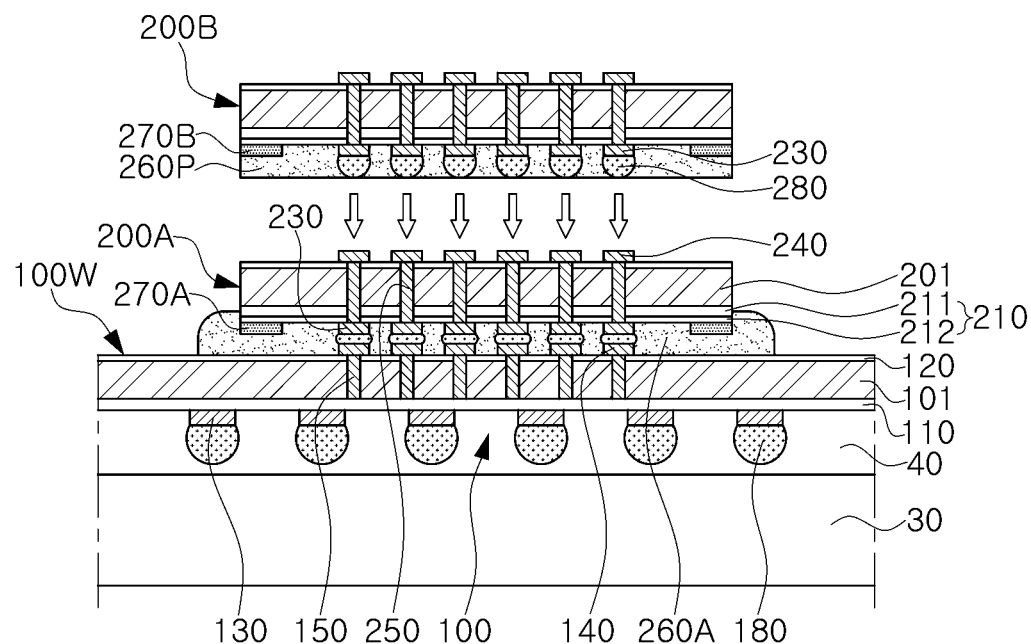

Referring to FIG. 8C, the second semiconductor chip 200B may be attached on the first semiconductor chip 200A. The bumps 280 of the second semiconductor chip 200B may be attached to the first semiconductor chip 200A while being aligned with the second rear pads 240 of the first semiconductor chip 200A. The second semiconductor chip 200B may be attached to the first semiconductor chip 200A in a state in which the adhesive film 260P covering the plurality of bumps 280 and the organic material layers 270B are formed on the lower surface of the second semiconductor chip 200B.

Figure 8D:
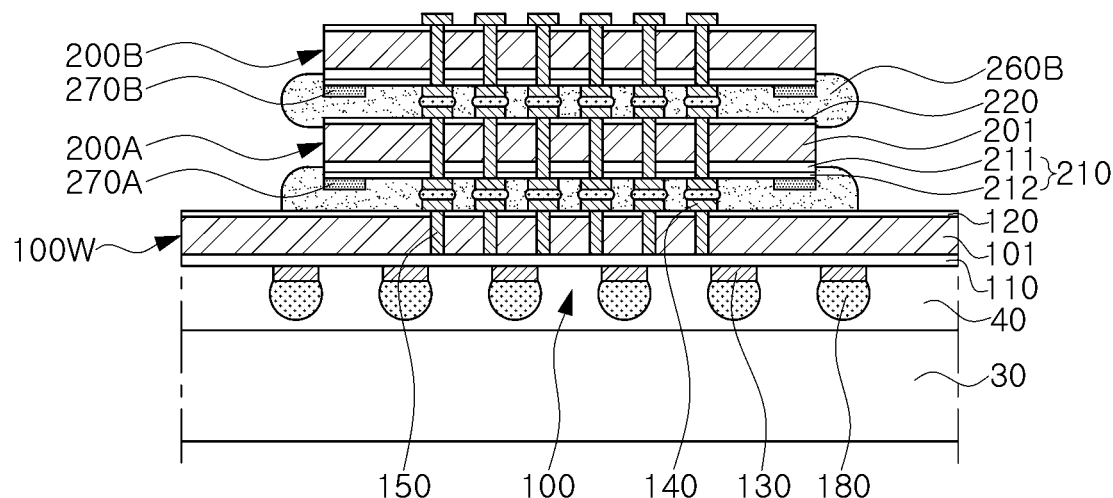

Referring to FIG. 8D, the second semiconductor chip 200B may be bonded to the first semiconductor chip 200A by performing a thermal compression bonding (TC) process on the second semiconductor chip 200B to which the adhesive film 260P is attached. After the thermal compression bonding process is performed, the adhesive film 260P may be reflowed and cured to form the second underfill layer 260B. In this case, an underfill outer portion protruding outwardly from the portion interposed between the first semiconductor chip 200A and the second semiconductor chip 200B may be formed.

The processes described in FIGS. 8C and 8D may be repeated to form the third semiconductor chip 200C, the fourth semiconductor chip 200D, the third underfill layer 260C, and the fourth underfill layer 260D and to form the encapsulant 290, and after performing a polishing process, the semiconductor wafer 100W may be cut along a scribe line to separate a plurality of base chips 100 to manufacture a semiconductor package 1000A including the base chip 100 and the semiconductor chips 200 stacked on the base chip 100.

According to embodiments of the present inventive concept, in packaging a plurality of semiconductor chips, an organic material layer may be disposed to increase adhesion between the semiconductor chip and the underfill layer, thereby providing a semiconductor package having increased reliability and production yield.

While example embodiments have been shown and described above, it will be apparent to those skilled in the art that modifications and variations could be made without departing from the scope of the present inventive concept as defined by the appended claims.

What is claimed is:

1. A semiconductor package comprising:
   a base chip including lower bumps disposed below a lower surface of the base chip;
   a plurality of semiconductor chips stacked on the base chip, each of the plurality of semiconductor chips having a front surface facing the base chip;
   a plurality of bumps, a lowermost bump of the plurality of bumps disposed between the base chip and a lowermost semiconductor chip of the plurality of semiconductor chips, and each of the plurality of bumps except the lowermost bump respectively disposed between the plurality of semiconductor chips;
   a plurality of organic material layers, a lowermost organic material layer of the plurality of organic material layers disposed between the base chip and the lowermost semiconductor chip, and each of the plurality of organic material layers except the lowermost organic material layer respectively disposed between the plurality of semiconductor chips;
   a plurality of underfill layers respectively surrounding the plurality of bumps, the plurality of underfill layers extending between the base chip and the lowermost semiconductor chip and between the plurality of semiconductor chips; and
   an encapsulant covering the base chip, the plurality of semiconductor chips, and the plurality of underfill layers,
   wherein each of the plurality of semiconductor chips includes a semiconductor substrate, a device layer disposed below the semiconductor substrate, a passivation layer forming the front surface of the each of the plurality of the semiconductor chips below the device layer, and front pads disposed below the passivation layer, and
   wherein each of the plurality of organic material layers extends along an edge region of the front surface of each of the plurality of semiconductor chips, and contacts the passivation layer of each of the plurality of semiconductor chips.

2. The semiconductor package of claim 1, wherein lower surfaces of the plurality of organic material layers are in contact with the plurality of underfill layers, respectively.

3. The semiconductor package of claim 1, wherein the plurality of organic material layers are spaced apart from the encapsulant.

4. The semiconductor package of claim 1, wherein the plurality of organic material layers include photosensitive polyimide (PSPI).

5. The semiconductor package of claim 1, wherein the passivation layer includes at least one of silicon oxide, silicon nitride, and silicon oxynitride.

6. The semiconductor package of claim 1, wherein each of the plurality of underfill layers includes an underfill inner portion vertically overlapping the plurality of semiconductor chips and an underfill outer portion not vertically overlapping the plurality of semiconductor chips, and
the underfill outer portions of the plurality of underfill layers are in contact with outer side surfaces of the plurality of organic material layers, respectively.

7. The semiconductor package of claim 6, wherein the underfill outer portion of each of the plurality of underfill layers protrude outward from a center of each edge region of the front surface of the plurality of semiconductor chips in a convex shape in a plan view.

8. The semiconductor package of claim 6, wherein the underfill outer portions of the plurality of underfill layers protrude outward from a center of each corner region of the front surface of the plurality of semiconductor chips in a plan view.

9. The semiconductor package of claim 1, wherein the edge region of the front surface includes first, second, third, and fourth edge regions respectively including sides of the front surface in a plan view, and
the plurality of organic material layers include first, second, third, and fourth organic material patterns that are respectively disposed in the first, second, third, and fourth edge regions in the plan view.

10. The semiconductor package of claim 1, wherein at least a portion of the plurality of organic material layers extends along a quadrangular border of the front surface of the plurality of semiconductor chips in a plan view.

11. The semiconductor package of claim 1, wherein the plurality of underfill layers include a first underfill layer between the base chip and the lowermost semiconductor chip, and
wherein the semiconductor package further comprising:
a first lower organic material layer extending along an edge region of an upper surface of the base chip and contacting the first underfill layer.

12. The semiconductor package of claim 1, wherein the base chip includes a base substrate and base through-electrodes, the base through-electrodes passing through the base substrate and electrically connected to the front pads of the plurality of semiconductor chips, and
wherein the semiconductor package further comprising:
an interposer substrate disposed below the base chip and including connection pads electrically connected to the base through-electrodes;
an interposer underfill layer disposed between the interposer substrate and the base chip; and
a second lower organic material layer surrounded by the interposer underfill layer and extending along an edge region of a lower surface of the base chip.

13. A semiconductor package comprising:
a plurality of semiconductor chips;
a plurality of bumps respectively disposed between the plurality of semiconductor chips;
at least one underfill layer surrounding the plurality of bumps and contacting at least a portion of outer side surfaces of the plurality of semiconductor chips, the at least one underfill layer extending between the plurality of semiconductor chips;

at least one organic material layer having an upper surface in contact with an edge region of a lower surface of each of the plurality of semiconductor chips and a lower surface in contact with the at least one underfill layer; and an encapsulant covering the at least one underfill layer and the plurality of semiconductor chips.

14. The semiconductor package of claim 13, wherein the at least one organic material layer includes a first organic material layer in contact with a first semiconductor chip of the plurality of semiconductor chips, and an outer side surface of the first organic material layer is substantially coplanar with an outer side surface of the first semiconductor chip.

15. The semiconductor package of claim 13, wherein the at least one underfill layer includes a fillet portion protruding onto outer side surfaces of the plurality of semiconductor chips, wherein the fillet portion is in contact with an outer side surface of the at least one organic material layer.

16. The semiconductor package of claim 13, wherein the at least one organic material layer includes photosensitive polyimide (PSPI).

17. The semiconductor package of claim 13, wherein a thickness of the at least one organic material layer ranges from about 200 nm to about 500 nm.

18. A semiconductor package comprising:

a base chip including lower bumps;

a plurality of semiconductor chips disposed on the base chip and each of the plurality of semiconductor chips including a front surface facing the base chip and front pads disposed below the front surface;

a plurality of bumps, a lowermost bump of the plurality of bumps disposed between the base chip and a lowermost semiconductor chip of the plurality of semiconductor chips, and each of the plurality of bumps except the lowermost bump respectively disposed between the plurality of semiconductor chips;

at least one organic material layer disposed between the plurality of semiconductor chips;

at least one underfill layer surrounding the plurality of bumps and the at least one organic material layer and contacting at least a portion of outer side surfaces of the plurality of semiconductor chips; and an encapsulant covering the base chip, the at least one underfill layer, and the plurality of semiconductor chips, wherein the at least one organic material layer is disposed to be horizontally adjacent to an outer side surface of the plurality of semiconductor chips, and a minimum width of the at least one organic material layer is greater than a width of each of the front pads.

19. The semiconductor package of claim 18, wherein each of the plurality of semiconductor chips includes a semiconductor substrate, a device layer, and a passivation layer below the semiconductor substrate, wherein the passivation layer is disposed between the device layer and the each of the front pads and between the device layer and the at least one organic material layer, and wherein the passivation layer includes at least one of silicon oxide, silicon nitride, and silicon oxynitride.

20. The semiconductor package of claim 19, wherein the passivation layer includes a first region and a second region surrounding the first region, wherein the front pads are disposed in the first region, and the at least one organic material layer is in contact with the second region of the passivation layer.

* * * * *